United States Patent
Billenstein et al.

(10) Patent No.: US 6,178,092 B1
(45) Date of Patent: *Jan. 23, 2001

(54) SUBRACK WITH PLUG-IN MODULES HAVING CENTERED FRONT PLATES

(75) Inventors: Ernst Billenstein, Burgbernheim; Werner Körber, Betzenstein; Siegfried Kurrer, Nuremberg; Kurt-Michael Schaffer, Eckental, all of (DE)

(73) Assignee: Siemens Aktiengesellschaft, Munich (DE)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/215,273

(22) Filed: Dec. 18, 1998

Related U.S. Application Data

(63) Continuation of application No. PCT/DE97/01146, filed on Jun. 6, 1997.

(30) Foreign Application Priority Data

Jun. 18, 1996 (DE) .......................................... 296 10 693 U

(51) Int. Cl.[7] ...................................................... H05K 5/00
(52) U.S. Cl. .......................... 361/759; 361/740; 361/756; 361/797; 361/801; 361/802; 211/41.17
(58) Field of Search .................................... 361/728, 730, 361/740, 741, 752, 753, 756, 796, 801, 802, 759; 211/26, 41.17

(56) References Cited

U.S. PATENT DOCUMENTS 5,375,724 * 12/1994 Mazura ................................. 211/26

FOREIGN PATENT DOCUMENTS

| 2348170 | 4/1975 | (DE) . |
|---|---|---|
| 8533398U1 | 3/1986 | (DE) . |
| 4130355C1 | 9/1992 | (DE) . |
| 296 02 426 U1 | 5/1996 | (DE) . |
| 0527608A1 | 2/1993 | (EP) . |
| 2599927 | 12/1987 | (FR) . |

OTHER PUBLICATIONS

Catalog "europac lab HF", EMC Schroff, D Sep. 1994 7/7 (39600–100), Sep. 1994, 3 pages.

* cited by examiner

*Primary Examiner*—Jayprakash N. Gandhi
(74) *Attorney, Agent, or Firm*—Sughrue, Mion, Zinn, Macpeak & Seas, PLLC

(57) ABSTRACT

In a subrack, the front plates have shank screws which extend through the front plates and are fitted into the front plates so that the front plates have virtually no ability to move, i.e., have no "play", in the radial direction, but the shank screws can still be rotated and be displaced in the axial direction. The shank screws advantageously undertake two functions simultaneously in this arrangement. When a module is inserted into the subrack, the front plate is simultaneously centered by the shank screw. It can also subsequently be fixed accurately in position on the subrack by the same shank screw. As a result, a multiplicity of modules can be inserted into the subrack next to one another without mutual hindrance.

10 Claims, 2 Drawing Sheets

SUBRACK WITH PLUG-IN MODULES HAVING CENTERED FRONT PLATES

This is a Continuation of International Application PCT/DE97/01146, with an international filing date of Jun. 6, 1997, the disclosure of which is incorporated into this application by reference.

FIELD OF AND BACKGROUND OF THE INVENTION

The invention relates to new and useful improvements in subassembly racks with plug-in modules. More particularly, the invention relates to subracks with at least one plug-in module that is provided with a front plate for mounting the module to the subrack.

In conventional subracks, the metallic front plates of plug-in modules generally form a closed, electromagnetically screening front side. The gaps between the individual front plates of the modules are generally bridged with electromagnetic screening by contact spring elements on the front plate. One resulting problem is that the front plates can be slightly displaced between the gaps by the horizontal lateral forces produced because of the contact spring elements. Because of the combined offsets of a number of front plates, one given opening may have too small a width to receive its intended front plate. A module which is to be inserted last between several modules already mounted in place can thus no longer be pushed into the subrack, or can be pushed in only with a risk of damaging the contact spring elements.

A subrack for plug-in modules provided with front plates is known, e.g., from German Patent DE 41 30 355 C1 and from the catalog "europac lab HF, EMC Schroff, D 9/94 7/7 (39600-100)" from the company Schroff GmbH. Longitudinally arranged, equidistant threaded holes for screwing on front plates are provided on two front module rails. The front plates have at least one fastening screw on the top and on the bottom. In addition to the fastening screws, at least one additional centering pin is arranged on the back side of each of the front plates. When a plug-in module is inserted, these centering pins connect into corresponding centering holes arranged in front of the threaded holes, and serve to position the individual front plates in the positions provided at the respective slot on the subrack.

It is disadvantageous that, apart from the fastening screws, centering pins are additionally required to be fitted on the back of the front plates. These centering pins have to be fashioned onto the front plates in their accurate position since, in particular when the front plates are produced by an extrusion process, the centering pins cannot be integrally formed at the same time as the front plates themselves during the production process. One result is a disadvantageously increased outlay in terms of material. In addition, an increased number of production steps is needed for manufacturing the front plates.

OBJECTS OF THE INVENTION

It is therefore an object of the invention to provide a subrack with modules which have front plates configured in a less complicated way. It is a further object to provide a subrack with modules that can be positioned satisfactorily on the subrack and can be inserted and withdrawn without difficulty.

SUMMARY OF THE INVENTION

These and other objects of the invention are achieved by the teachings of the independent claims. Particularly advantageous refinements of the invention are the subject matter of the dependent claims.

The subrack according to the invention has the advantage that the front plate is configured with screws reaching through it. The screws are preferably designed in the form of shank screws which can be fitted into the front plate so that the front plate has virtually no ability to move, i.e., has no play, in the radial direction, but the shank screws can still be rotated and be displaced in the axial direction.

It is particularly advantageous that the shank screws of the front plates simultaneously undertake two functions. Specifically, when the module is plugged into the subrack, the front plate is simultaneously centered by the shank screws and can be fixed accurately in position on the subrack by the same shank screws.

Another advantage is the reduced outlay associated with manufacturing the front plates for a subrack according to the invention, relative to that for conventional arrangements.

BRIEF DESCRIPTION OF THE DRAWINGS

The invention and further advantageous refinements thereof are explained in more detail below with the aid of diagrammatic, exemplary embodiments in the drawing, in which.

DETAILED DESCRIPTION OF THE PREFERRED EMBODIMENTS

Figure 1:
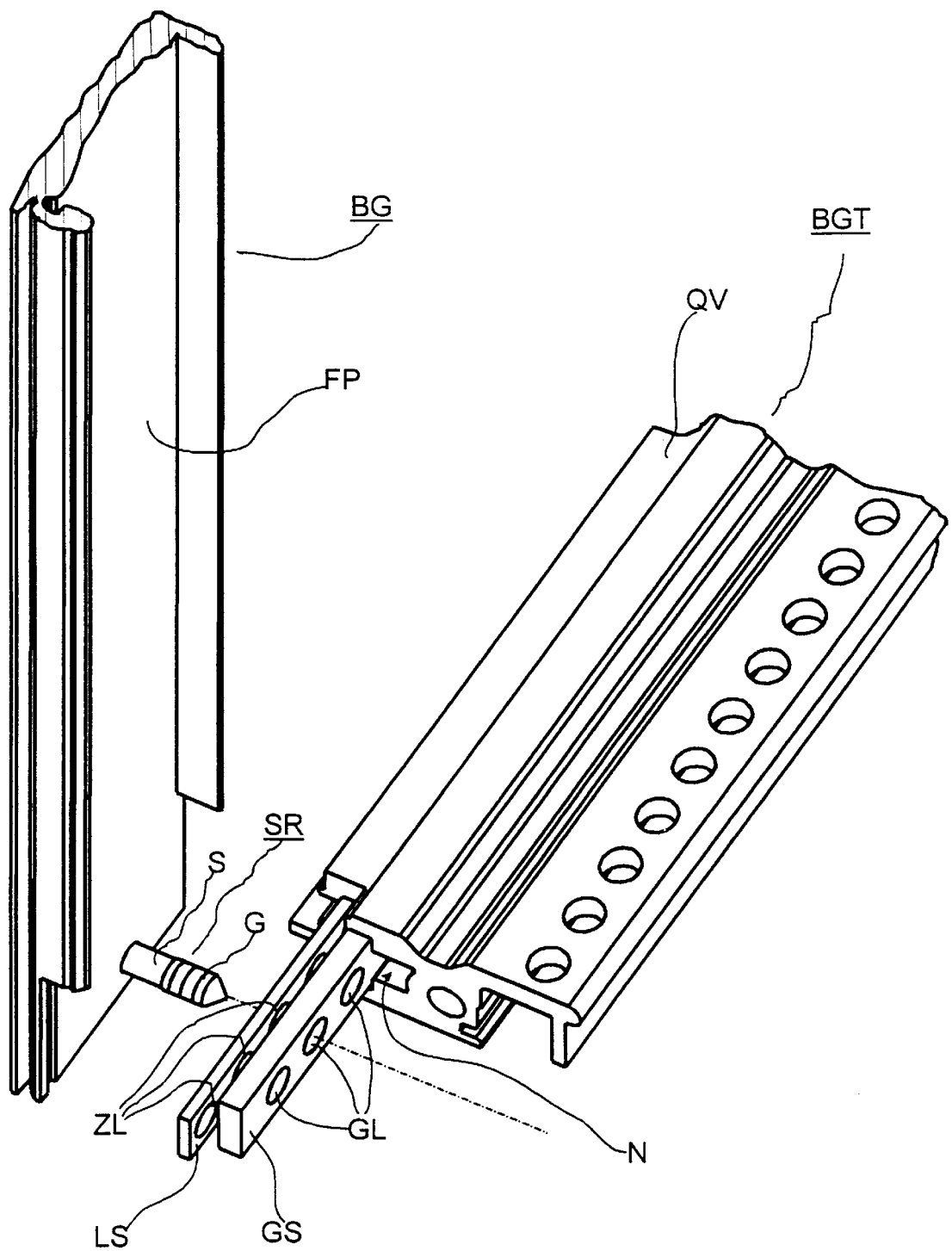
FIG. 1 shows a perspective side view of a front plate of a plug-in module and a front transverse rail of a subrack according to the invention.

Represented in FIG. 1 is a perspective side view of a front plate FP of a module BG and of a "cut away" lower front transverse rail QV of a subrack BGT. The subrack BGT generally has two front transverse rails QV for screwing on the front plate FP by means of screws. The screws can advantageously be designed as shank screws SR. The transverse rails QV in this case have guide means which serve to center and fix the screws of the front plates FP. The transverse rail QV preferably has guide means arranged longitudinally in a row, which are marked in FIG. 1 by the reference symbols N, LS, ZL, GS and GL. These guide means respectively have a front centering region, marked by LS and ZL, and a rear threaded region marked by GS and GL.

Figure 2:
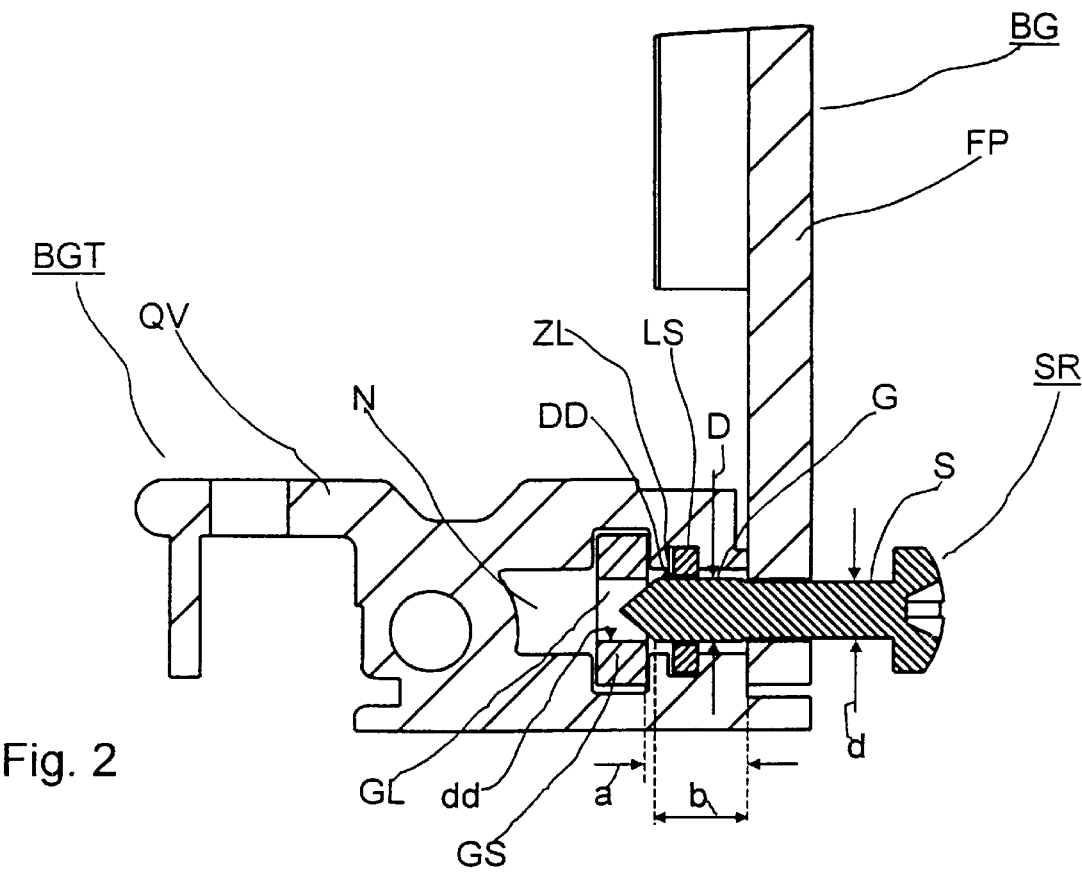
FIG. 2 shows a sectional representation of a front transverse rail of an inventive subrack with the front plate of a module which is being mounted onto the subrack and which is being positioned by the shank screw.

In particular, the guide means of the present embodiment have a centering strip LS in which equidistant centering holes ZL arranged longitudinally in a row are provided for the purpose of forming the front centering region. The guide means further have a threaded strip GS which is arranged behind the centering strip LS and in which equidistant threaded holes GL arranged longitudinally in a row are provided for the purpose of forming the rear threaded region. The guide means also have a profiled longitudinal groove N in the transverse rail QV, which opens towards the front plate FP, and into which the centering strip LS and the threaded strip GS are inserted. As is represented in FIG. 2, the centering holes ZL have a diameter DD which is larger than the threaded diameter dd of the threaded holes GL. According to an embodiment which is not specifically illustrated, the centering strip LS and the threaded strip GS are manufactured in one piece. According to yet another embodiment, the guide means can be fashioned as bores provided at the front in the transverse rail QV.

In accordance with an advantageous further embodiment of the invention, as represented in FIG. 1, the screw is designed in the form of a shank screw SR with a shank part S and a threaded part G. The shank screw SR is matched to the front plate FP in this case such that the shank part S on the one hand reaches approximately true to size through the front plate FP and thus has virtually no radial play relative to the screw SR. On the other hand, the shank part S, however, still rotates in the front plate FP and moves virtually exclusively in an axial fashion relative to the screw SR. As represented in FIG. 2, the threaded part G has a thread outside diameter D which is larger than the shank diameter d of the shank part S.

FIG. 2 shows a sectional representation of the front transverse rail QV of a subrack BGT. Here, the front plate FP of a pushed-in module BG is centered by the shank screw SR. Upon the front plate FP being laid against the transverse rail QV, the threaded part G of the shank screw SR reaches into a centering hole ZL of the centering strip LS and thereby centers the front plate FP in the radial direction. The thread outside diameter D of the threaded part G of the shank screw SR is advantageously therefore slightly smaller than the diameter DD of the centering holes ZL. The threaded part G of the shank screw SR therefore becomes centered in the centering hole ZL in a fashion which is virtually immovable radially. The threaded part G has a length b which is slightly smaller than the distance a of the threaded strip GS from the front plate FP laid against the transverse rail QV. The threaded part G of the shank screw SR thus already serves in the centering hole ZL to center the front plate FP before being screwed into the threaded hole GL of the threaded strip GS.

By means of the array provided by the equidistantly arranged centering holes ZL and threaded holes GL, the front plate FP of a module BG can be positioned selectively in accordance with this array at different slots of the subrack BGT. This is particularly advantageous in the case of subracks BGT into which modules BG with different thicknesses must be inserted and in which, as a result, the remaining modules have to be reinserted in an appropriately displaced fashion.

Figure 3:
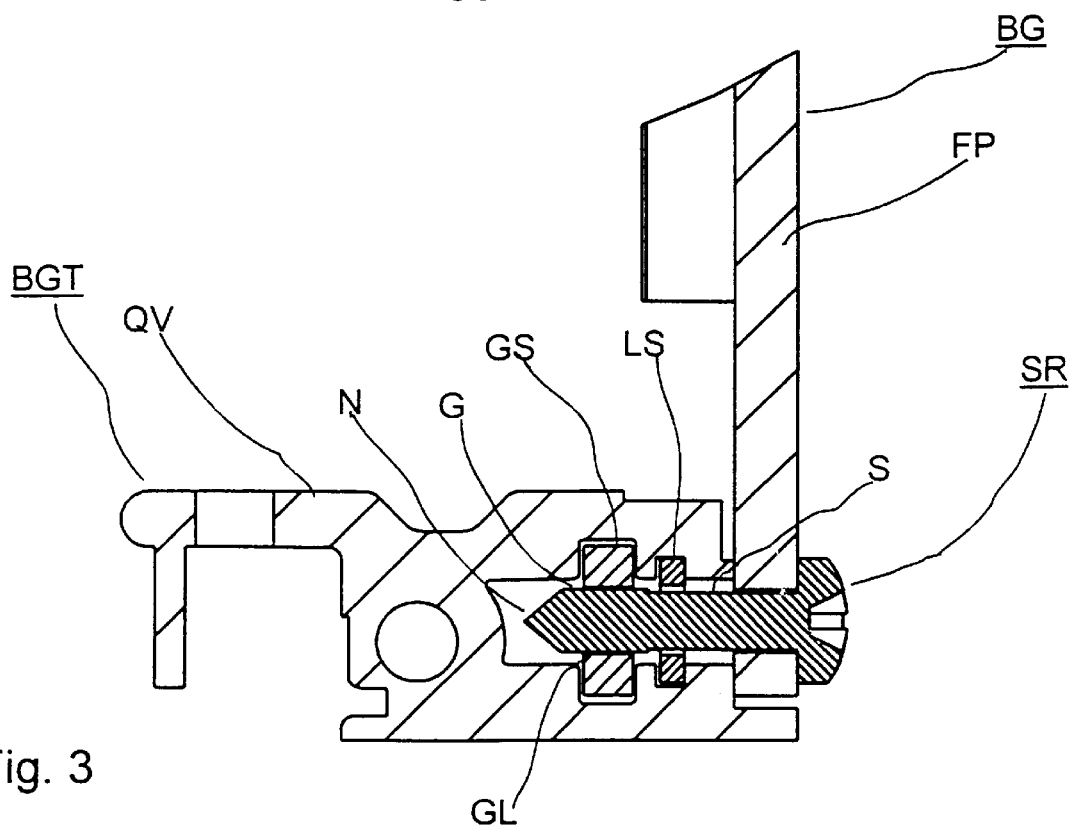
FIG. 3 shows a sectional representation of the subrack represented in FIG. 2, with the front plate fully screwed on and secured by the shank screw.

After being laid against the front transverse rail QV of the subrack BGT, as depicted in FIG. 2, the front plate FP is subsequently screwed firmly onto the transverse rail QV by the same shank screw SR that was used to center the front plate FP by means of the centering strip LS. In particular, the threaded part G of the shank screw SR is screwed into the threaded hole GL, arranged behind the centering hole ZL, of the threaded strip GS as illustrated in FIG. 3. The shank screw SR therefore advantageously undertakes, on the one hand, the function of positioning the front plate FP when the module BG is plugged into the subrack BGT, and, on the other hand, the same shank screw SR additionally serves to fasten the front plate FP to the subrack BGT.

A front plate FP preferably has at least one shank screw SR both in the upper and in the lower end region, in order to fasten the front plate FP of the module BG to both an upper and a lower front transverse rail QV of the subrack BGT.

One particular advantage of the invention is that the shank screws SR of the front plate FP simultaneously undertake two functions. When the module BG is plugged into the subrack BGT, the front plate FP is simultaneously centered by the shank screws SR and is subsequently screwed accurately into position on the subrack BGT by the same shank screws SR. It is therefore advantageously possible to insert a multiplicity of modules BG into the subrack BGT next to one another without mutual hindrance.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. A subrack assembly comprising:
   a subrack;
   at least one plug-in module;
   at least one front plate for mounting said module to said subrack; and
   at least one screw extending through an opening in said front plate for mounting said front plate to said subrack;
   wherein:
   a) said subrack comprises at least one front transverse rail for mounting said front plate to said subrack, said transverse rail including guide means having a front centering region and a rear threaded region,
   b) a diameter of said screw is matched to a diameter of the opening of said front plate, to thereby substantially prevent displacement of said front plate relative to said screw in directions radial to said screw,
   c) said screw extends into the front centering region of said guide means with a portion of said screw having a diameter matched to a diameter of the front centering region, to thereby center said front plate in directions radial to said screw, and
   d) said screw further extends into the rear threaded region of said guide means with a portion of said screw having a diameter matched to a diameter of the rear threaded region, to thereby mount said front plate onto said transverse rail.

2. The subrack assembly as claimed in claim 1, wherein: said screw is configured as a shank screw comprising a shank part and a threaded part; and
   a) said shank part extends with a diameter approximately true to size through the opening of said front plate in a rotatable and axially movable fashion,
   b) said threaded part of said screw extends into the front centering region of said guide means when said front plate lies against said transverse rail, to thereby center said front plate in the radial directions, and
   c) said threaded part of said screw further extends into the rear threaded region of said guide means, to thereby mount said front plate onto said transverse rail.

3. The subrack assembly as claimed in claim 2, wherein said shank part of said shank screw, extending through the opening of said front plate, has a shank diameter which is smaller than a thread outside diameter of said threaded part of said shank screw.

4. The subrack assembly as claimed in claim 1, wherein said guide means comprises:
   a) a centering strip having equidistant centering holes arranged longitudinally in a row along said transverse rail as the front centering region; and b) a threaded strip arranged behind said centering strip relative to said front plate and having equidistant threaded holes arranged longitudinally in a row along said transverse rail as the rear threaded region.

5. The subrack assembly as claimed in claim 4, wherein said guide means further comprises a profiled longitudinal groove, which is configured to support said centering strip and said threaded strip, and which is open towards said front plate.

6. The subrack assembly as claimed in claim 1, wherein said guide means has a diameter for receiving said screw in the front centering region which is larger than a thread diameter of said guide means in the rear threaded region.

7. The subrack assembly as claimed in claim 1, wherein:
said screw is configured as a shank screw comprising a shank part and a threaded part; and
said shank part extends into the front centering region when said front plate is mounted onto said transverse rail.

8. An apparatus, comprising:
a subrack comprising a laterally extending front guide rail;
a plug-in module comprising a front plate; and
a screw for mounting said front plate to said guide rail;
wherein said front guide rail comprises:
a first strip extending along said guide rail and having a series of threaded holes; and
a second strip extending along said guide rail and interposed between said first strip and said front plate, said second strip having a series of through-holes aligned laterally with the threaded holes; and
wherein said front plate abuts said guide rail, and said screw extends through said front plate, through one of the through-holes of said second strip, and into one of the threaded holes of said first strip, to thereby provide a fastening mechanism, consisting of said screw, the one through-hole and the one threaded hole, that is the sole mechanism for fixedly orienting said front plate laterally with respect to said guide rail and firmly mounting said front plate to said guide rail.

9. The apparatus as claimed in claim 8, wherein each of the through-holes has a diameter for receiving said screw in said second strip such that a diameter of said screw is matched to the diameter of each of the through-holes.

10. The apparatus as claimed in claim 8, wherein:
said screw is configured as a shank screw comprising a shank part and a threaded part; and
said shank part extends into said second strip when said front plate is firmly mounted to said guide rail.

* * * * *